United States Patent [19]
Haddad et al.

[11] Patent Number: 5,077,691
[45] Date of Patent: Dec. 31, 1991

[54] FLASH EEPROM ARRAY WITH NEGATIVE GATE VOLTAGE ERASE OPERATION

[75] Inventors: Sameer S. Haddad, San Jose; Chi Chang, Redwood City; Antonio Matalvo, San Francisco; Michael A. Van Buskirk, San Jose, all of Calif.

[73] Assignee: Advanced Micro Devices, Inc., Sunnyvale, Calif.

[21] Appl. No.: 426,332

[22] Filed: Oct. 23, 1989

[51] Int. Cl.$^5$ .............................................. G11C 11/40
[52] U.S. Cl. ................................. 365/218; 365/185; 365/200
[58] Field of Search ............... 365/185, 200, 218, 104, 365/201

[56] References Cited

U.S. PATENT DOCUMENTS

| | | | |
|---|---|---|---|
| 4,532,535 | 7/1985 | Gerber et al. | 365/185 X |
| 4,698,787 | 10/1987 | Mukherjee et al. | 365/185 |
| 4,823,318 | 4/1989 | D'Arrigo et al. | 365/185 X |
| 4,958,321 | 9/1990 | Chang | 365/185 |

OTHER PUBLICATIONS

R. Cernea et al., "A 1Mb Flash EEPROM", 1989 IEEE International Solid-State Circuits Conference, Feb. 16, 1989, pp. 138-139, 316.
V. Kynett et al., "A 90ns 100K Erase/Program Cycle Megabit Flash Memory", 1989 IEEE International Solid-State Circuits Conference, Feb. 16, 1989, pp. 140-141, 317.
S. Tam et al., "A High Density CMOS 1-T Electrically Erasable Non-Volatile (Flash) Memory Technology", IEEE Electron Devices Society, Digest of Technical Papers, May 1988, pp. 31-32.
S. D'Arrigo et al., "A 5V-Only 256K Bit CMOS Flash EEPROM", IEEE International Solid-State Circuits Conference, Feb. 16, 1989, pp. 132-133, 313.
G. Samachisa et al., "A 128K Flash EEPROM Using Double-Polysilicon Technology", IEEE Journal of Solid-State Circuits, vol. SC-22, No. 5, Oct. 1987, pp. 676-683.
S. Haddad et al., "Degradations Due to Hole Trapping in Flash Memory Cells", IEEE Electron Device Letters, vol. 10, No. 3, Mar. 1989, pp. 117-119.
M. Gill et al., "A 5-Volt Contactless Array 256KBIT Flash EEPROM Technology", IEEE International Electron Devices Meeting, Dec. 11-14, 1988, pp. 428-430.
C. Chang et al., "Drain-Avalanche and Hole-Trapping Induced Gate Leakage in Thin-Oxide MOS Devices", IEEE Electron Device Letters, vol. 9, No. 11, Nov. 1988, pp. 588-590.
C. Chang et al., "Corner-Field Induced Drain Leakage in Thin Oxide MOSFETS", IEEE International Electron Devices Meeting, Dec. 6-9, 1987, pp. 714-717.
S. Mukherjee et al., "A Single Transistor EEPROM CELL and Its Implementation in a 512K CMOS EEPROM", IEEE International Electron Devices Meeting, 1985, pp. 616-619.
Nov. 1990 IEEE article by Sameer Haddad, "An Investigation of Erase Mode Dependent Hole Trapping in Flash EEPROM Memory Cell", IEEE Electron Device Letters, vol. 11, No. 11, pp. 514-516.

(List continued on next page.)

Primary Examiner—Joseph A. Popek
Attorney, Agent, or Firm—Skjerven, Morrill, MacPherson, Franklin & Friel

[57] ABSTRACT

A flash EEPROM cell array is erased by applying a zero reference voltage to the bulk substrate of the cell, a relatively high negative voltage to the control gate of the cell and a relatively low positive voltage to the source region of the cell. Because of a relatively low reverse voltage developed between the source region of the cell and the bulk substrate, the generation of hot holes is inhibited and improved performance may be obtained. The source region is preferably single diffused rather than double-diffused so that the cell can occupy a minimum area for a given design rule. The low positive voltage applied to the source is preferably less than or equal to the voltage, $V_{CC}$ presented at a +5V chip power supply pin. This makes it possible for the +5V pin to directly supply source current during erasure.

51 Claims, 12 Drawing Sheets

OTHER PUBLICATIONS

*Electronics* magazine, Nov. 1990, pp. 44–53, "Look Out EPROMS, Here Comes Flash", by Samuel Weber.

"A 5 Volt Only 16M Bit Flash EEPROM Cell with a Simple Stacked Gate Structure", N. Ajika et al. of Mitsubishi Electric Corp; IEDM, Dec. 1990, pp. 115–117.

"A Novel Sublithographic Tunnel Diode Based 5V-Only Flash Memory", Gill, D'Arrigo et al. of Texas Instruments; IEDM Dec. 1990, pp. 119–122.

"Process Technology for 5-Volt Only 4 MB Flash EEPROM with 8.6 UM2 Cell", Gill et al. of Texas Instruments; IEEE Symposium on VLSI Technology, Jun. 1990, pp. 125–126.

FLASH EEPROM ARRAY WITH NEGATIVE GATE VOLTAGE ERASE OPERATION

BACKGROUND OF THE INVENTION

1. Field of the Invention

The invention is generally related to floating gate memory devices such as EEPROMs and more specifically to a method for erasing flash EEPROMs arrays.

2. Description of the Relevant Art

There is a class of nonvolatile memory devices known as "flash EEPPROM's" (electrically erasable programmable read only memory devices). The operation and structure of such devices is discussed in U.S. Pat. No. 4,698,787 issued Oct. 6, 1987, to Mukherjee et al., the disclosure of said patent being incorporated herein by reference. Another discussion respecting the operation and structure of flash EEPROM devices may be found in IEEE Journal of Solid State Circuits, Vol. SC-22, No. 5, October, 1987, pages 676–683 in an article entitled "A 128K Flash EEPROM Using Double-Polysilicon Technology" by Gheorghe Samachisa, et al., the disclosure of said article being incorporated herein also by reference. A key feature of "flash" EEPROM's which distinguishes them from standard EEPROM's is that a select transistor is not included on a one-for-one basis with each floating gate transistor to select one memory cell for erasing. Instead, the memory cells of a flash EEPROM chip are erased in bulk (i.e., either the entire chip or by paged groups each having a large number of floating gate transistors). Elimination of the select transistor allows for smaller cell size and this gives the flash EEPROM an advantage in terms of manufacturing yield over a comparably sized (in terms of memory capacity) standard EEPROM.

A plurality of flash EEPROM cells may be formed on a semiconductor substrate (i.e., a silicon die) to each comprise a N-type source region integrally formed within a P portion of the substrate, a N-type drain region integrally formed within the P substrate portion and spaced apart from the source region, a P-type channel region interposed between the source and drain regions, a floating gate electrode insulatively spaced by a short distance (i.e., 100 Å) above at least one of the source and drain regions, and a control gate electrode insulatively disposed above the floating gate electrode.

According to conventional operation, a flash EEPROM memory cell is "programmed" by inducing hot electron injection from a portion of the substrate (i.e., a channel section near the drain region) to the floating gate. Electron injection carries negative charge into the floating gate. This injection mechanism is normally induced by grounding the source region and a bulk portion of the substrate, applying a relatively high positive voltage to the control electrode (i.e., +12 volts) to create an electron attracting field and applying a positive voltage of moderate magnitude (i.e., approximately +6 V to +9 V) to the drain region (derived from a $V_{pp}$ programming pin as shown in FIG. 1B) in order to generate "hot" (high energy) electrons. After sufficient negative charge accumulates on the floating gate, the negative potential of the floating gate raises the threshold voltage of its field effect transistor (FET) and inhibits current flow through the channel during a subsequent "read" mode. The magnitude of the read current is used to determine whether an EEPROM cell is programmed or not. Typically, in the read mode, +2 V is applied to the drain, +5 V is applied to the control electrode and 0 V is applied to the source region of the memory cell.

In flash EEPROM arrays, all cells are usually erased simultaneously. This is because their source regions are all tied to a common source line. A relatively high positive voltage (i.e., +12 volts) which is derived from the $V_{pp}$ pin (FIG. 1B) is applied to the common source line during erasure. The control electrode and bulk substrate are grounded. The drain region is allowed to float. A strong electric field develops between the floating gate and source region, and negative charge is extracted from the floating gate to the source region by way of Fowler-Nordheim (F-N) tunneling. The dielectric spacing between the floating gate and source region (or drain region if F-N erasure is to be obtained through the drain) must be relatively small (i.e., around 100 Å or less of oxide) to permit such F-N mediated deprogramming (erasure) of the floating gate electrode.

A number of drawbacks may be associated with the conventional way in which flash EEPROM cells are erased. First, because different voltages, i.e., +6 V to +9 V, +5 V and 12 V, need to be applied to the drain and source regions of the device during programming, reading and erasure; it is often necessary to provide two off-chip power supplies for operating integrated circuit chips having such flash EEPROM's cells. There is a long-felt desire within the industry to develop a flash EEPROM integrated circuit chip which may be operated from only one power supply, i.e., +5 volts. Unfortunately, the magnitude of source to substrate current tends to be relatively high during erasure, on the order of approximately 1 microamp per cell, and as a result, the power requirement of a memory chip having one million or more memory cells (a 1 megabit chip) can be as high as one ampere. Self-limiting techniques are often used for reducing this source to substrate current to levels of approximately 20 to 30 milliamps, but even at these levels, it is difficult to provide enough current from an on-chip charge pump circuit. An external power source of approximately +12 V or higher is needed.

A second drawback of the conventional erase technique arises from the fact that a relatively high reverse voltage is generated between the source and substrate during erasure. (The P type substrate is at 0 V and the N type source region is at +12 V). A double-diffused source structure is normally employed (such as disclosed in Mukherjee, 4,698,787) to protect against undesirable reverse voltage breakdown of the source to substrate PN junction. The double-diffused source structure occupies more substrate area than would otherwise be occupied by a single-diffused source structure and accordingly it is difficult to provide high density flash EEPROM cell arrays on relatively small dies in a cost-effective manner.

A third drawback associated with the conventional erasure of flash EEPROM's wherein a relatively high positive voltage (i.e., +12 V) is developed at the source region, is that there is a substantial probability that high energy holes ("hot" holes generated by a so called "avalanche effect") might be formed at a surface portion of the source to substrate junction and that these holes will become trapped in the thin dielectric underlying the floating gate. To a smaller extent, there is a further danger that additional high energy holes will be generated by a so called "band to band conduction" mechanism and these will also be trapped in the gate dielectric.

The distinction between avalanche generated holes and band to band generated is discussed in an IEEE paper entitled "Drainholes Avalanche and Hole-Trapping Induced Gate Leakage in Thin-Oxide MOS Devices" by Chi Chang, et al., IEEE Electron Device Letters, Vol. 9, No. 11, November, 1988, pp. 588-590. This article is incorporated herein by reference.

The production of avalanche generated holes at the surface of the dielectric below the floating gate is undesirable because it can interfere with reliable programming, reading and erasure of randomly located memory cells (i.e., the gate disturb phenomenon), because it tends to decrease the charge retention time of the floating gate (holes trapped in the gate dielectric can migrate upwardly into the floating gate to neutralize the negative program charges in the floating gate). Specifically, during erasure, some memory cells may produce more hot holes than others and consequently their floating gates will be discharged at a faster rate. This creates a non-uniform erasure throughout the memory chip. Those holes which do not migrate to the floating gate during erasure can remain in the dielectric for random periods of time and then migrate to the floating gate, where they neutralize charge that is to be retained. Furthermore, during programming, trapped holes in the dielectric can cause undesirable programming of nonselected cells. These undesirable phenomena are further described in an article entitled "Degradations Due to Hole Trapping in Flash Memory Cells" by Sameer Haddad et al., IEEE Electron Device Letters, Vol. 10, No. 3, March, 1989, pages 117-119; said article being incorporated herein by reference. A further disadvantage of operation in the avalanche breakdown region is that it increases the magnitude of source current during erasure.

SUMMARY OF THE INVENTION

It is an object of the present invention to overcome the drawbacks mentioned above.

In accordance with the invention, selected memory cells of a flash EEPROM array are erased by applying a relatively high negative voltage (i.e., $-12$ V to $-17$ V) to the control gate electrode of each cell, a relatively low positive voltage (i.e., $+0.5$ V to $+5$ V) to the source region, a ground potential (0 V) to the substrate and a relatively high impedance to the drain region (i.e., the drain is allowed to float). A relatively strong potential is still created between the control electrode and the source region (i.e., $-12$ V to $-17$ V) for inducing Fowler-Nordheim tunneling but the source to substrate reverse voltage is kept at $+5$ V or less.

The limitation of the source to substrate reverse voltage to positive levels below approximately 5 volts reduces the magnitude of leakage current passing from the source to the substrate. Whereas before, the source current per cell was on the order of $1.0\ 10^{-6}$ amperes during erasure, it can now be reduced to a per cell level in approximately the range $1.0\ 10^{-7}$ amps or less. In chips having more than 1 million memory cells, the power savings can be substantial.

Reduction of the source to substrate voltage to or below the $V_{cc}$ pin level ($+5$ V) further means that it can be supplied from the same power source which supplies the read and program voltages to the drain ($V_{cc}=+5$ V, for example). Moreover, the reduced source to substrate voltage allows for a single-diffused source structure in place of the previous double-diffused source structure thereby permitting smaller cell areas and higher density arrays. The reduced source to substrate reverse voltage also eliminates or substantially reduces the generation of hot holes by the avalanche effect mechanism. These hot holes are the predominant ones which might become trapped in the dielectric between the floating gate and the substrate surface. The inhibition of hot hole generation by the avalanche effect reduces programming and erasure reliability problems associated with previous flash EEPROM arrays. Moreover, the data retention time of a programmed floating gate is increased by virtue of the fact that fewer hot holes are available for becoming trapped in the floating gate dielectric and for migrating therefrom into the floating gate.

The reduction of the source to substrate reverse voltage to a level of approximately $+5$ V or less further means that the $V_{cc}$ pin normally used for supplying $+5$ V to the memory cells of a chip during the read operation may also be used for supplying both the required voltage and current to the source region during erasure. A charge pump does not need to be used for generating a source voltage (i.e., $+12$ V) greater than the $V_{cc}$ pin level (i.e., $+5$ V). Instead, direct connection to the $V_{cc}$ pin or connection to the $V_{cc}$ pin through a voltage regulator circuit may be made for supplying the voltage and current requirements of each source region in a flash EEPROM array during bulk erasure. Accordingly, a separate $V_{pp}$ pin is not required for supplying the source voltage during bulk erase and the pin count of the chip may be thus reduced. Additionally, because hot hole current is diminished, current flow through the gate terminal during erasure is primarily for supporting Fowler-Nordheim tunneling rather than for supporting hot hole conduction. When the magnitude of current to the control gate is decreased for erasure, it becomes easier to supply a negative erase voltage to the control gate by use of an on-chip charge pump. It becomes possible to build a flash EEPROM integrated circuit chip which operates with only one off-chip power supply (i.e., 8 $+5$ V supplied through the $V_{cc}$ pin) instead of two off-chip power supplies. The negative and positive gate voltages (i.e., $-12$ V and $+12$ V) needed for erasure and programming a chip in accordance with the invention may be instead respectively supplied by two on-chip charge-pumps circuits of relatively small size.

Preferably, the dielectric underlying the floating gate in each memory cell of a flash EEPROM chip according to the invention is of uniform thickness at least between the source and drain regions. Such uniformity simplifies the manufacture of high density chips (i.e., such as when a small cell size of 3.0 micron by 3.0 micron or less is manufactured with one micron technology or a finer technology). Smaller cell size means that a smaller voltage (i.e., $+1$ V instead of $+2$ V) is needed at the drain during reading and similarly a smaller drain voltage (i.e., $+6$ V instead of $+9$ V) is needed during programming.

BRIEF DESCRIPTION OF THE DRAWINGS

The invention will be described with reference to the accompanying figures in which.

DETAILED DESCRIPTION OF THE PREFERRED EMBODIMENTS

The following detailed description is of the best modes presently contemplated by the inventors for practicing the invention. It should be understood that the descriptions of these preferred embodiments is merely illustrative and that they should not be taken in a limiting sense.

Figure 1A:
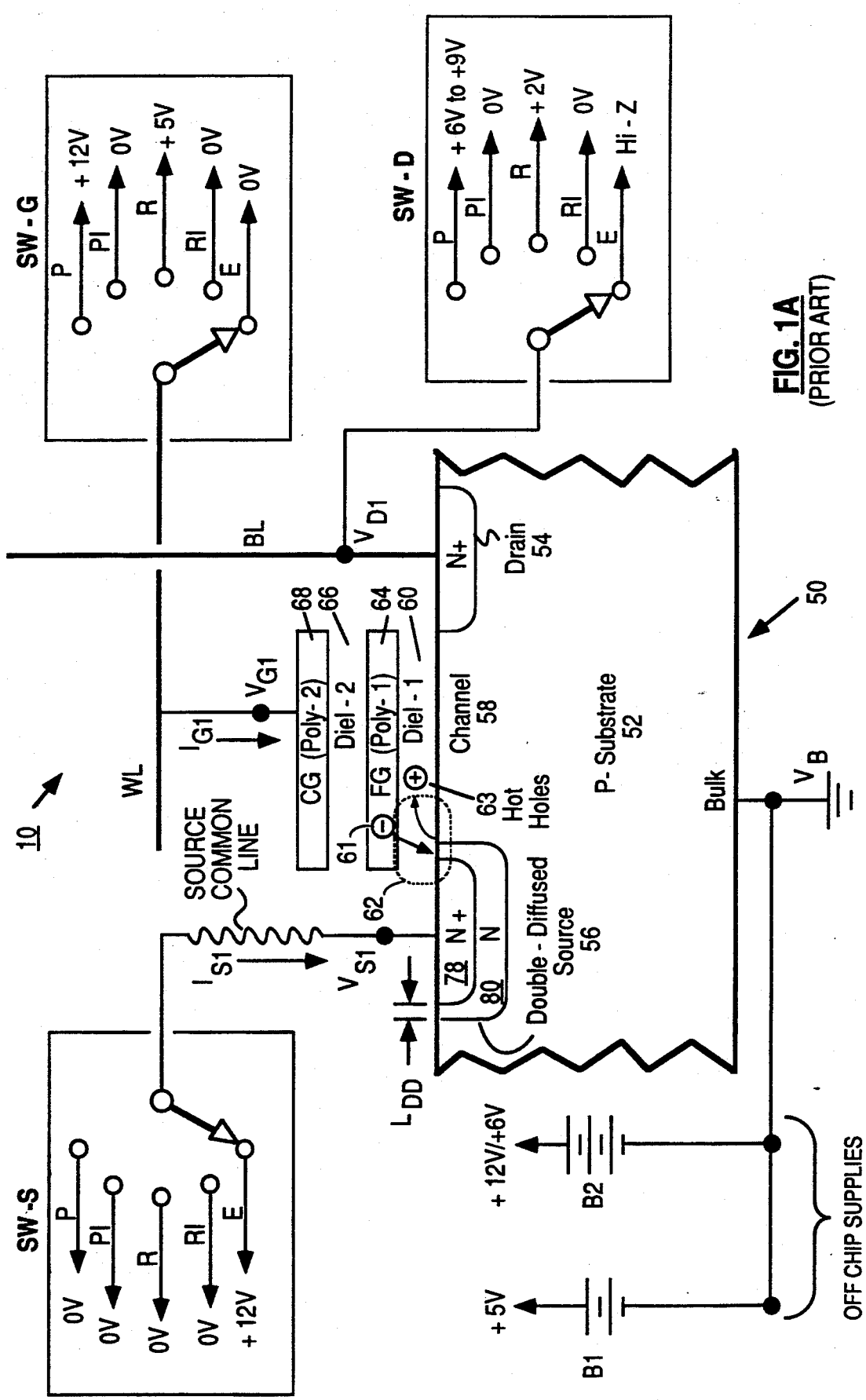
FIG. 1A is a cross-sectional view of a conventional circuit used for programming, reading and erasing a memory cell in a flash EEPROM array.
Figure 1B:
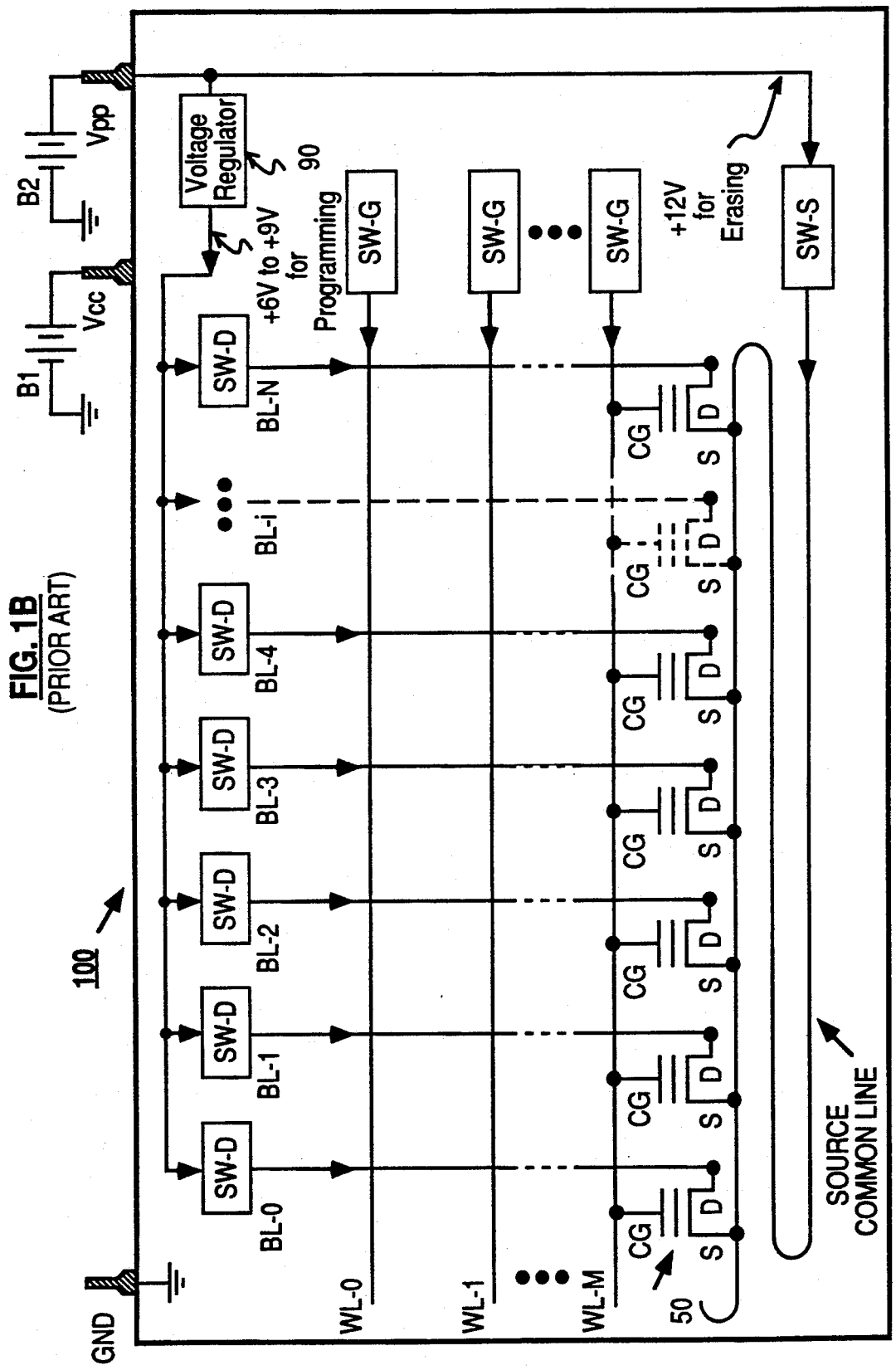
FIG. 1B is a chip layout diagram showing how plural flash EEPROM cells are positioned relative to their drive circuitry of an integrated circuit die.

Referring to FIG. 1A, there is shown a cross-sectional view of a flash EEPROM cell 50 and a conventional circuit 10 for programming, reading and erasing a floating gate provided therein. It is to be understood that a large number, NxM (i.e., 1,000 or more), of such cells 50 are typically provided on a single integrated circuit chip in an NxM matrix form and that the power requirements of the entire chip (as shown in FIG. 1B) are NxM times that of a single cell 50.

As seen in FIG. 1A, a flash EEPROM cell 50 may be formed on a P-type substrate 52 having embedded therein a N+drain region 54 and a N-type double-diffused source region 56. The double-diffused source region 56 is formed of a deeply diffused but lightly doped N well 80 (phosphorous doped) and a more heavily doped but shallower N+ well 78 (arsenic doped) embedded within the deep N well 80. The deep N well 80 diffuses outwardly from the shallow well 78 to a dimension which is twice a double diffusion length, $L_{DD}$ as denoted in FIG. 1A. A relatively thin gate dielectric layer 60 (i.e., oxide of approximately 100 Å thickness) is interposed between the surface of the substrate 52 and a conductive polysilicon floating gate 64. A polysilicon control gate 68 is insulatively supported above the floating gate 64 by an interpoly dielectric layer 66.

As described, the memory cell 50 is one of a large number, NxM (i.e., one thousand, one million, etc.), of cells provided at a core portion of a memory chip 100 (FIG. 1B) in an orderly, matrix-like fashion. As shown in FIG. 1B, the poly-2 layer (upper polysilicon layer) which forms the control gate 68 is patterned to define M horizontally extending word lines (WL). An insulated and overlying layer of metal (metal-1 layer) is patterned to form N vertically extending bit lines (BL) which cross over the M horizontally extending word lines (WL) to define a cell addressing grid. Each memory cell 50 of the array is positioned at the intersection of a word line (WL) with a bit line (BL). The control gate (CG) 68 of each memory cell is defined by an overlying word line (WL) while the drain region 54 is tied to an overlying bit line (BL). A common source line (formed by a conductive path diffused in the substrate) couples the source regions 56 of all the memory cells 50 one to the next.

Referring to FIG. 1A, the circuitry 10 for operating each memory cell will now be explained. The operating circuitry 10 comprises a source switching circuit SW-S which is connected to the source regions 56 of all cells 50 through the source common line. A gate switching circuit SW-G is provided for each of the horizontally extending word lines (WL) to drive a corresponding row of memory cells. A drain switching circuit SW-D is provided for each of the vertically extending bit lines (BL) to drive a corresponding column of memory cells 50.

The three switching circuits, SW-S, SW-G and SW-D, are each shown to have five switching positions in FIG. 1A. These five switching positions are respectively labeled as "P" to denote a cell programming mode, "PI" to denote a row or column programming inhibit mode, "R" to denote a cell reading mode, "RI" to denote a row or column read inhibit mode and "E" to denote a cell erasing mode.

During programming, it is desirable to program a specific one memory cell 50 in a specific row and column while inhibiting the programming of other memory cells provided on the memory chip. The operating switches (SW-S, SW-G and SW-D) of rows and columns that are to be not programmed are each set to the program inhibit (PI) position The operating switches of the row and column of a cell 50 which is to be programmed are differentially set to the cell programming position (P). In this programming position (P), the source 56 of the to-be-programmed memory cell is tied to ground, the drain 54 is tied to a relatively high voltage (i.e., +6 V to +9 V) and the control gate is connected to a relatively high voltage level (i.e., +12 V). Electrons are accelerated from the source 56 to the drain 54 and so-called "hot electrons" are generated near the drain region 54. Some of the hot electrons are injected through the relatively thin gate dielectric 60 (Diel-1) and become trapped in the floating gate (FG) 64 thereby giving FG 64 a negative potential. This programming mode requires relatively large currents from the power supply B2 which supplies the +12 V voltage to the integrated circuit chip 100 (see FIG. 1B) through the programming pin $V_{pp}$. The same programming pin, $V_{pp}$, supplies power to an on-chip voltage regulator 90 for generating the +6 V to +9 V voltage applied to the drain 54 of the cell during programming.

When a desired cell in a predetermined row and column is to be read, the operating switches of all other rows and columns are placed in the read inhibit position (RI) and the operating switches of the row and column of the cell that is to be read are placed in the read position (R). Power is drawn only from the B1 power supply (+5 V) through the $V_{cc}$ pin in this mode. The $V_{pp}$ programming pin is not used.

During erasure, all the operating switches of all memory cells are placed in the cell erasing position (E). A relatively high positive voltage $V_S = +12$ V is applied to each source region 56. A ground potential $V_G = 0$ V is applied to each control gate 68. The bulk substrate voltage $V_B$ is set equal to zero. The voltage VD of each drain region 54 is allowed to float. In this mode, electrons 61 previously stored during programming in the floating gate 64 pass through a floating gate to source overlap area 62 by way of Fowler-Nordheim tunneling and travel into the source region 56 as a result of the electric field established between the control gate 68 and the source region 56 ($V_{GS} = -12$ V). Typically, all cells are programmed before bulk erasure commences.

The N-type source well 80 is reversed biased relative to the P-type substrate 52 during the erase mode (E) as a result of the positive voltage +12 V applied at the source terminal. High energy holes 63 may be generated in the tunneling region 62 of the substrate surface primarily as a result of the so-called avalanche effect and to a lesser extent as a result of the so-called band-to-band conduction effect, and these holes 63 may become trapped in the thin gate dielectric layer 60. (Diel-1).

Several disadvantages arise from operating the source region at the high voltage level of approximately +12 V. This high voltage is responsible for the generation of a large number of hot holes 63 created by the avalanche effect The ability of the floating gate 64 to retain negative charge (electrons) when the cell 50 is not being erased (data retention time), is degraded by trapped holes because these trapped holes have a tendency to migrate to the floating gate and to neutralize the negative charge therein. The magnitudes of the source current $I_{S1}$ and corresponding power $I_{S1}V_{S1}$ that are needed for erasing each cell 50 in a large NxM array of such cells is significantly increased because of avalanche operation. Two separate power supplies, +5 V and +12 V, each having significant current and/or power supplying capabilities are therefore required for operating the chip 100 in the programming (P) and bulk erase (E) modes.

Figure 2A:
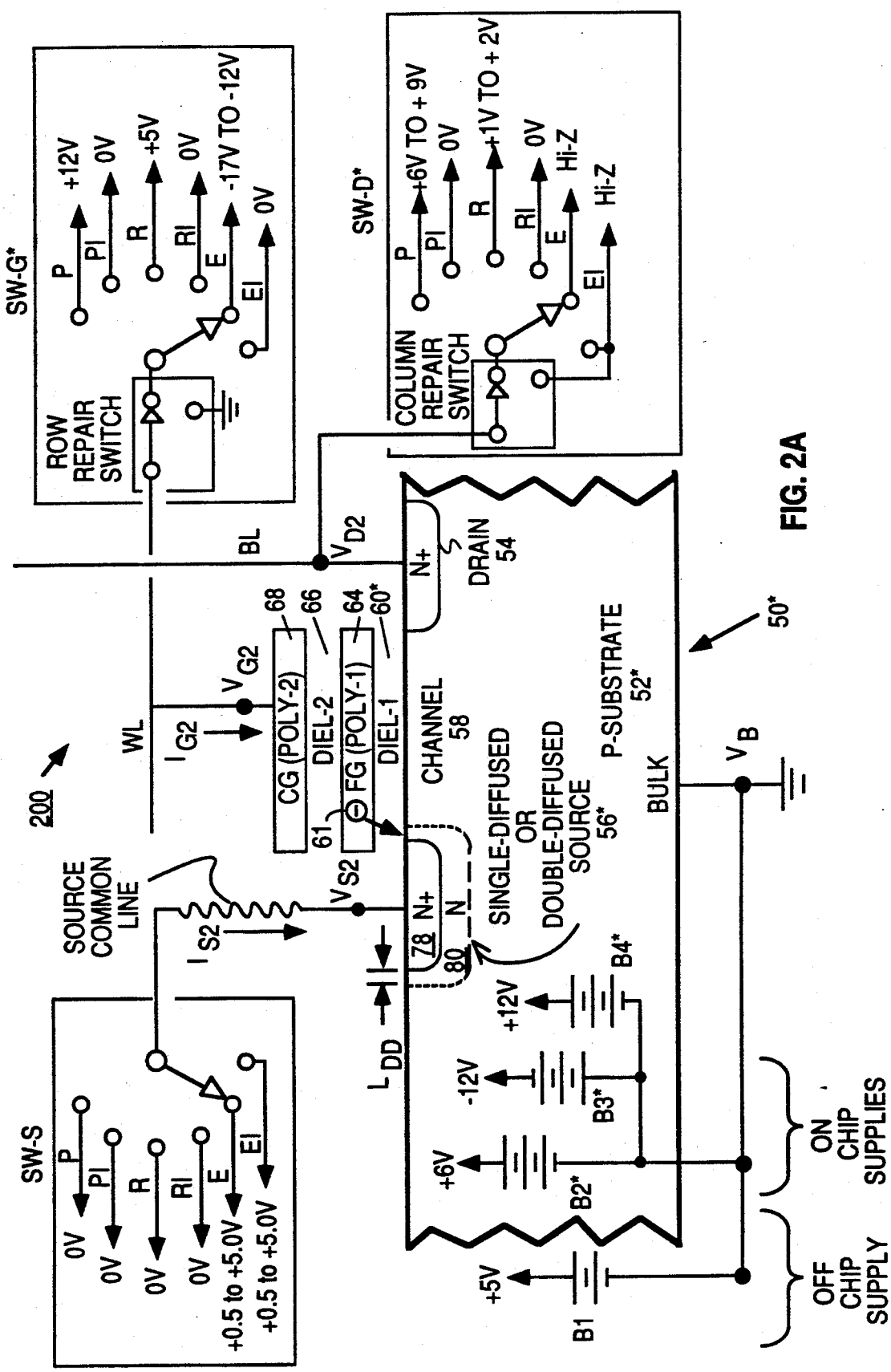
FIG. 2A is a schematic diagram of a circuit for programming, reading and erasing a memory cell in a flash EEPROM array in accordance with the invention.

Referring to FIG. 2A, a similar flash EEPROM cell 50* is shown to be driven by operating circuitry 200. Like reference numerals are used in FIG. 2A to denote like elements already described for FIG. 1A. An asterisk (*) is used in the reference numerals to denote different elements. A primary difference in structure arises from the fact that in FIG. 2A, the gate dielectric layer 60* is less subject to degradation by trapped hot holes forming during erasure, and accordingly, over long term operation, the gate dielectric layer 60* of FIG. 2A performs more reliably than the gate dielectric layer 60 of FIG. 1A. Another difference is that the power consumption factor, $V_{S2}I_{S2}$, of the structure 50* shown in FIG. 2A may be made substantially less than $V_{S1}I_{S1}$.

As shown in FIG. 2A, in the erase mode, a negative voltage and preferably a relatively high negative voltage (i.e., $-12$ V to $-17$ V) is applied to the control gate 68. The source region 56 is coupled to a relatively low positive voltage such as $V_S = +0.5$ V to $+5.0$ V (and more preferably $+2.0$ V to $+5.0$ V) during erasure. The source current $I_{S2}$ can still be relatively high, on the order of 20 to 30 milliamps for the entire chip, but it is supplied at a voltage level $V_{S2}$ which is less than or equal to the $V_{cc}$ (i.e. +5 V) power supply. The current requirements of the control gates, $I_{G2}$ is relatively small, on the order of 1 nanoamp or less per cell, so the negative voltage $V_{G2}$ can be generated with a charge pump circuit that is integrally provided on the same integrated circuit chip to selectively repair in either or both of the row and column directions. The preferred potential difference $V_{SF}$ between the control gate and source is on the order of 17 volts and accordingly, when the source voltage $V_S$ is made less positive, the control gate voltage $V_G$ should be made more negative. Once the source to floating gate voltage $V_{SF}$ is selected, the remaining factors are preferably constrained according to the equation:

$$V_{SF} = V_S - V_F = V_S - (C_{CF}(-\Delta V_T)) - (C_{CF}V_C) - (C_{SF}V_S)$$

where:
  $C_{CF}$ = the capacitive coupling coefficient between the control gate and floating gate;
  $C_{SF}$ = the capacitive coupling coefficient between the source and the floating gate;
  $\Delta V_T$ = the threshold voltage difference arising from negative charge added the floating gate, as this difference is measured from the control gate;
  $V_C$ = the voltage between the control gate and substrate; and
  $V_S$ = the voltage between the source region and the substrate.

The drain region 54 is allowed to float during erasure and is coupled to +6 V during programming. The bulk substrate 52 is grounded ($V_B = 0$) during both programming and erasure. The deep diffused N well 80 of source 56* is optional since the reverse voltage between the shallow source well 78 and the substrate 52 is the difference between the low positive level (i.e. $V_S = +0.5$ V to +5 V) and $V_B = 0$ instead of the 12 volts which develops in the structure of FIG. 1A. When the source region 56* is single-diffused (deep well 80 is not included), the double diffusion overlap distance $L_{DD}$ is no longer present and cell size can be reduced (by approximately 10%).

The reduced power requirements of supplies greater than $V_{cc}$ or less than zero volts makes it possible to place the power supply circuits, B2*, B3* and B4*, that generate the gate voltage (i.e., $V_G = -12$ V to $-17$ V) during erasure and the drain voltage (i.e., $V_D = +6$ V) during programming, integrally on the same semiconductor substrate which supports the memory cells 50*. Only one external power supply B1 (i.e., +5 V) is needed for powering the chip during all of the programming, reading and erasing modes. This simplifies the design of memory boards on which many flash EEPROM chips 210 (FIG. 2B) are to be placed.

Figure 2B:
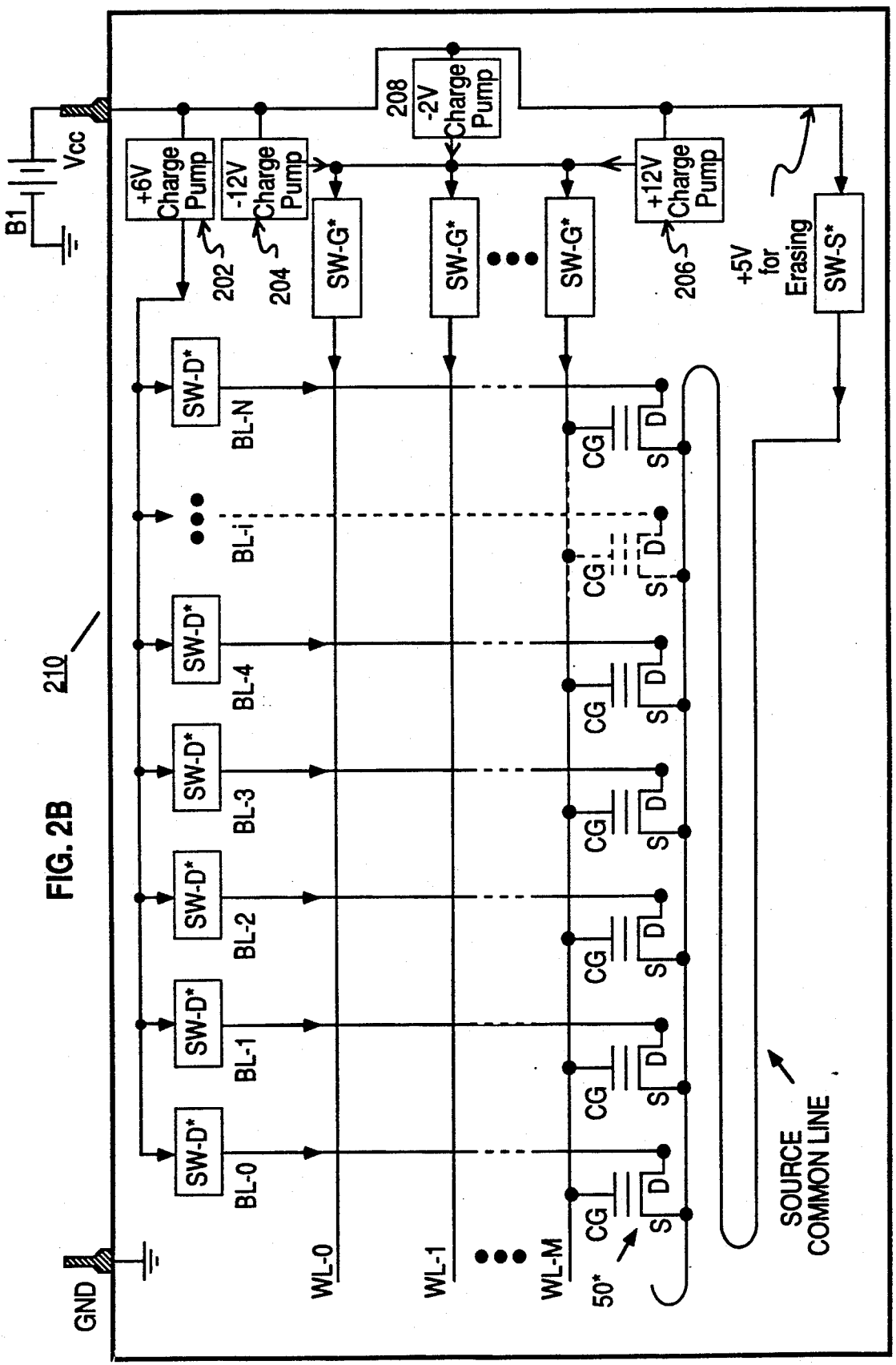
FIG. 2B is a chip layout diagram showing how plural flash EEPROM cells are positioned relative to their drive circuitry in an integrated circuit die according to the invention.

Referring to FIG. 2B, which is a layout diagram of an integrated circuit chip 210 in accordance with the invention, it can be seen that only one power supply pin $V_{cc}$ and one ground pin Gnd are needed for providing all the voltages necessary for reading, programming and erasing. The +5 V and +2 V needed respectively at the gate and drain of each cell for reading may supplied directly from the $V_{cc}$ pin to the memory cells through their corresponding gate and drain switching circuits SW-G* and SW-D*.

During programming, a first positive voltage charge pump 202 generates the +6 V potential needed at the drains. A negative charge pump 204 is used to supply the −12 V potential applied to the control gate (CG) during erasing. Because little current is required for charging the dielectric isolated control gates of each memory cell, it is possible to integrally form the charge pump circuit 204 in a relatively small area of the integrated circuit chip 210. The low level positive potential (i.e., $V_{SS}$= +5 V or less) needed at the source during erasing is supplied through the $V_{cc}$ pin as well The external power supply B1 which is coupled to the $V_{cc}$ pin should be able to supply the large current demands of the source common line during erasure.

The difference in current and/or power requirements for the flash EEPROM cell structures shown in FIGS. 1A, 1B and 2A, 2B may be seen by referring to FIGS. 3A, 3B, 3C and 3D.

Figure 3A:
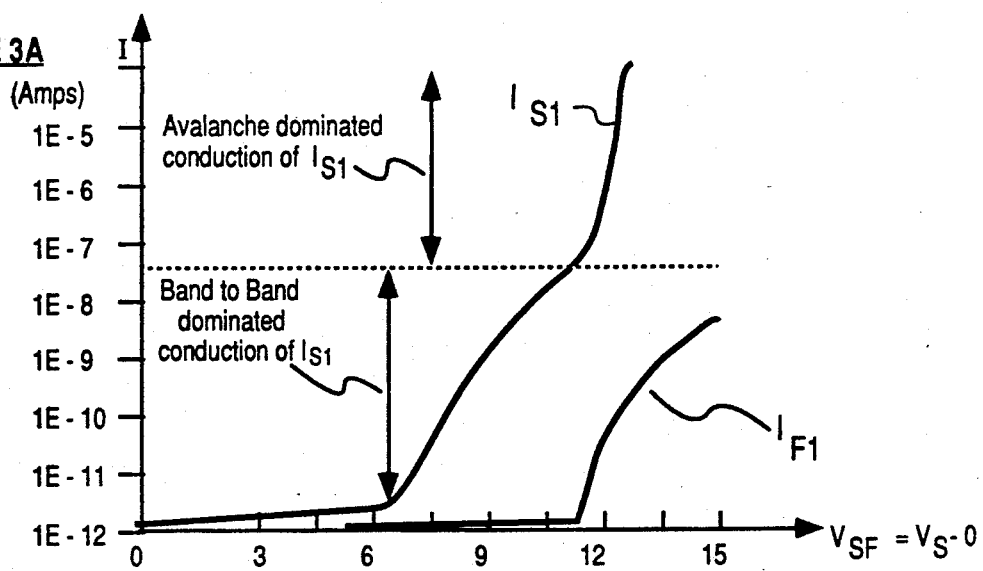
FIG. 3A is a graph showing the relationship between source to floating gate voltage ($V_{SF1}$) and source and gate currents ($I_{S1}$ and $I_{F1}$) using the erasing techniques of FIG. 1A.
Figure 3B:
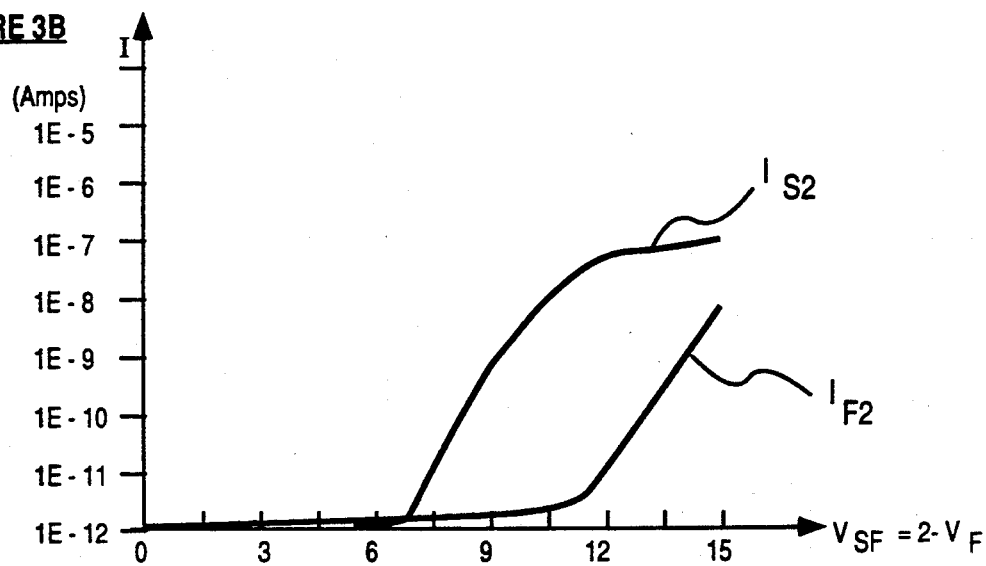
FIG. 3B is a graph showing the relationship between source to floating gate voltage ($VSF_2$) and the source and floating gate currents ($IS_2$ and $IF_2$) using the erasing technique of FIG. 2A.
Figure 3C:
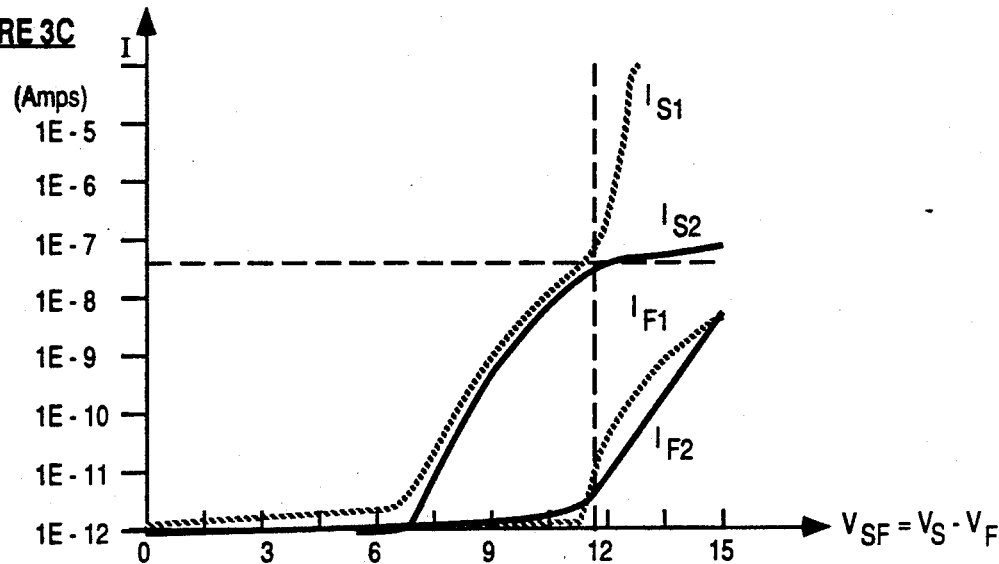
FIG. 3C is a composite graph of the curves shown in FIGS. 3A and 3B for comparing the magnitudes of the respective source and floating gate currents of the techniques employed in FIGS. 1A and 2A.
Figure 3D:
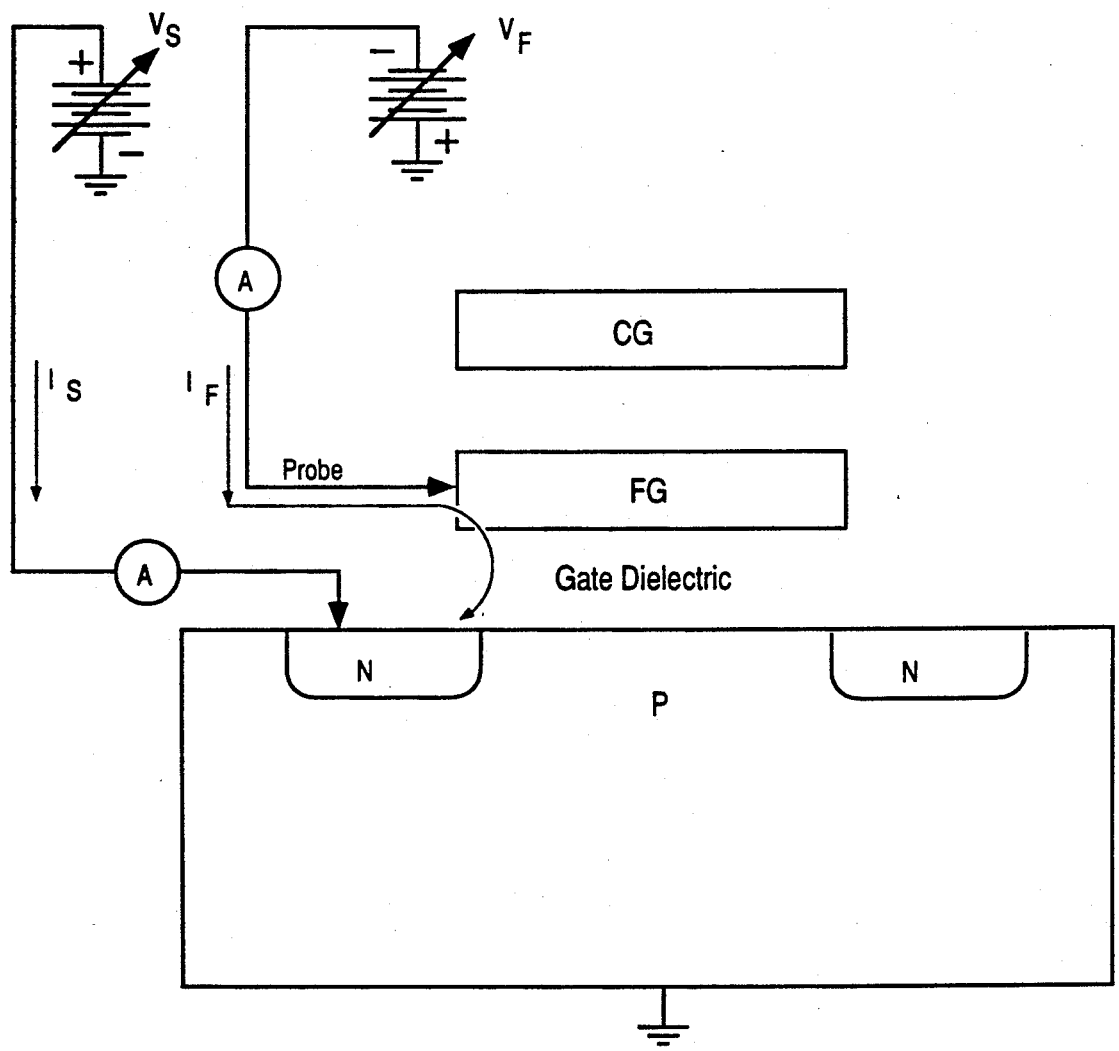
FIG. 3D is a schematic diagram of the experimental setup used for measuring the current levels shown in FIGS. 3A–3C.

FIG. 3D is a schematic diagram of an experimental setup used for measuring the magnitude of current ($I_F$) passing from a probed floating gate (FG) to the source region during erasure and the magnitude of source current $I_S$ pass through the source region to the substrate during erasure. Respective source and floating gate power supplies, $V_S$ and $V_F$ are varied in accordance with the experimental results described below. Suitable current measuring devices (A) are included in the probe lines to the probed floating gate (FG) and the source region (S) during the experiment.

Referring to FIGS. 3A and 3B, an erasing operation was first simulated by applying a relatively high positive voltage to the source region while maintaining the floating gate (FG) at ground and then an erasing technique in accordance with the invention was simulated by applying a relatively large negative voltage (i.e., −12 V) to the floating gate (FG) while maintaining the voltage at the source region in the range of approximately 0 V to +5 V. The horizontal axes of FIGS. 3A-3C represent the voltage difference $V_{SF} = V_S − V_F$ as this voltage difference $V_{SF}$ is linearly swept from a value of 0 V to a value of +15 V. The vertical axes of FIGS. 3A-3C represent the magnitude of source current $I_{Sx}$ and floating gate current $I_{Fx}$ where x=1 denotes the currents generated by simulating the erase operation of FIG. 1A and x=2 denote the currents generated by simulating the erase operation of FIG. 2A. The current magnitudes are logarithmically plotted along the vertical axes at an incremental rate of one decade per graph division in FIGS. 3A-3B, the lowest level of current magnitude being 1.0 10$^{-12}$ amperes (1 picoampere) and the highest level being 1.0 10$^{-5}$ amperes (10 microamps).

For FIG. 3A, the floating gate voltage $V_F$ was kept constant at 0 V and the source voltage $V_S$ was swept from 0 V to +15 V thereby sweeping the voltage difference $V_{SF}$ between 0 and +15 V. In FIG. 3B, the source voltage $V_S$ was kept constant at +2.0 V while the gate voltage $V_F$ was swept from 0 to −13 V thereby again sweeping the voltage difference $V_{SF}$ between 0 and +15 V. Those skilled in the art will readily appreciate that the voltage on the floating gate $V_F$ may be calculated based on the voltage applied to the control gate CG in actual devices, since the floating gate FG of actual devices is completely isolated from probing but its potential is capacitively coupled from the control gate CG and from the source region.

As seen in FIG. 3A, the source current $I_{S1}$ increases dramatically at approximately $V_F$=12 V, indicating the beginning of junction breakdown (avalanche effect). The floating gate current $I_{F1}$ begins to increase just below $V_{SF}$=12 V indicating substantial current flow through the gate dielectric (Diel-1) by the F-N tunneling mechanism, but a "bump" appears in the $I_{F1}$ curve just above $V_{SF}$=12 V indicating the initialization of the avalanche effect which generates an undesirable number of "hot" holes.

Referring to FIG. 3B, it can be seen that the source current $I_{S2}$ does not increase exponentially as $V_{SF}$ goes above 12 V. This indicates that the source to substrate junction is not yet breaking down. It can also be seen in the $I_{F2}$ gate current curve of FIG. 3B that there is no "bump" in the curve of the gate current. This indicates that F-N tunneling is the primary current mechanism and that the avalanche effect does not produce a substantial contribution, if any, to the magnitude of the gate current $I_{F2}$. FIG. 3C shows the curves of FIG. 3A and 3B superimposed one above the other so that the "bump" in the $I_{F1}$ curve can be more clearly discerned and so that the exponential increase of the $I_{S1}$ current can be easily visualized in comparison to the $I_{S2}$ current. The reduced magnitude of $I_{S2}$ in comparison to $I_{S1}$ indicates that avalanche breakdown is not occurring within the $I_{S2}$ flow mechanism in the range of approximately $V_{SF}$=12 V to 15 V.

The below table indicates the preferred modes of operation for the structure shown in FIGS. 2A and 2B.

TABLE I

| Operation Mode | $V_G$ | $V_D$ | $V_S$ |
|---|---|---|---|
| Read | $V_{CC}$ | +1.0 V to +2.0 V | 0 V |
| Cell Programming | +12 V | +6 V | 0 V |
| Program Inhibit of Row | 0 V | +6 V or 0 V | 0 V |
| Program Inhibit of Column | +12 V or 0 V | 0 V | 0 V |
| Erase | −17 V to −12 V | Float | $V_{ss}$ |
| Erase Inhibit of Row | 0 V to $V_{ss}$ | Float | $V_{ss}$ |

In the above Table I the value $V_{ss}$ may be varied in the positive range just above zero to $V_{cc}$, preferably, +0.5 V to +5.0 V, and more preferably in the range +2.0 V +5.0 V.

Several advantages accrue from the fact that a negative erase voltage is applied through the word lines (WL) to the control gate rather than applying a positive erase voltage through the source common line to the source regions of all memory cells in a flash EEPROM array simultaneously. Erasure can be made to occur selectively on a row by row basis rather than by having to erase all the memory cells of a chip simultaneously. Preferably, groups of rows are formed such that each group defines a page-selectable erase block. During a page-erase mode, a relatively high negative voltage (i.e., −12 V) is applied to the control gates of the selected page while zero voltage is applied to the control gates of memory cells in nonselected rows. Although the source regions of all transistors is raised to a positive level of approximately $V_{ss}$= +0.5 V to +5.0 V, this will not be sufficient to erase memory cells whose control gate voltages are less than or equal to the common source line level $V_{ss}$ (i.e., those transistors having 0 V to $V_{ss}$ on their control gates). When $V_{ss}$ is applied to the control gates for inhibiting erasure, a long term "slow-erase" problem is eliminated.

The ability to erase on a row by row basis further gives designers the ability to include spare (redundant) rows of memory cells which may be used in situations where row repair is required. As shown in FIG. 2A, a row repair switch is included in the circuitry SW-G* for selectively activating or deactivating a desired row (word line) of memory cells when repair is desired and for conversely activating a spare row of memory cells to replace a deactivated row. Column repair is achieved in a similar fashion with a column repair switch as shown in the circuitry SW-D*. Thus it is possible to selectively repair in either or both of the row and column directions. Previously, row repair could not be realized in flash EEPROM arrays because the source terminals of a defective row were coupled to the same common source line that good cells were coupled to. Erasure of the good cells (by raising the common source line to +12 V) resulted in so-called "over-erasing" of a defective row, since the defective row, once deactivated by repair, could never be programmed to avoid over-erasing. Typically, all memory cells within a flash EEPROM have to be first "programmed" (their floating gates have to be taken negative) before they can be erased. Eventually, an over-erased memory cell in a defective row becomes highly conductive and interferes with the recognition of read currents from other cells on its shared bit line (BL). But, with the availability of row by row erasure (selected by applying a negative voltage to the word lines, WL), it is possible to selectively not erase the memory cells of a defective row and accordingly, disturbance to their corresponding bit lines is minimized.

A further advantage of using a negative voltage at the control gate for erasing arises from the reduced reversed voltage at the source to substrate PN junction. Because the reverse voltage is in the range of approximately 0.5 V to 5.0 V during erasure, it is not necessary to provide the source region with a double-diffused structure. Accordingly, the area on the substrate required for forming the source region is less than that required for forming a double-diffused source region, and cell size can thereby be reduced by utilizing a single-diffused source region instead. A reduction in cell size of approximately 10% may be realized. With a 1 micron design rule, it should be possible to form a cell occupying the theoretical limit of 3.0 microns by 3.0 microns. The diffusion overlap distance $L_{DD}$ does not have to be factored into cell size determination.

Figure 4B:
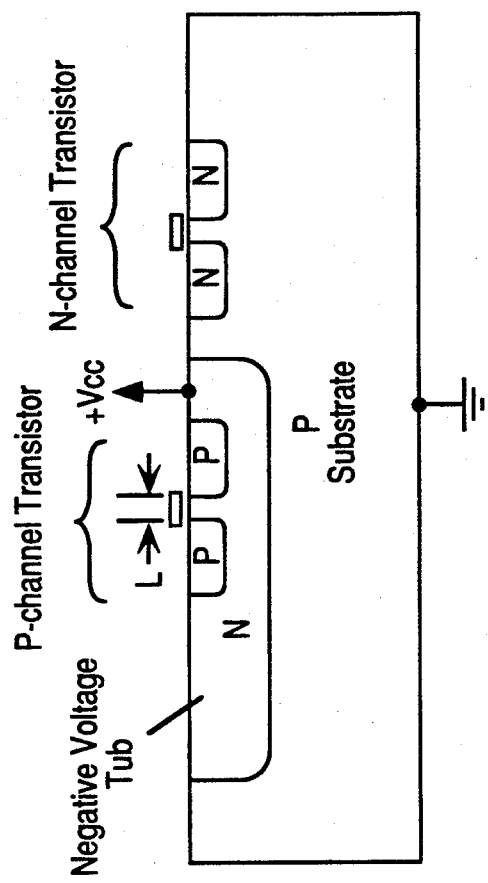
FIGS. 4A to 4C are schematic diagrams of charge pump circuits for generating −12 V and −2 V levels in accordance with the invention.
Figure 4A:
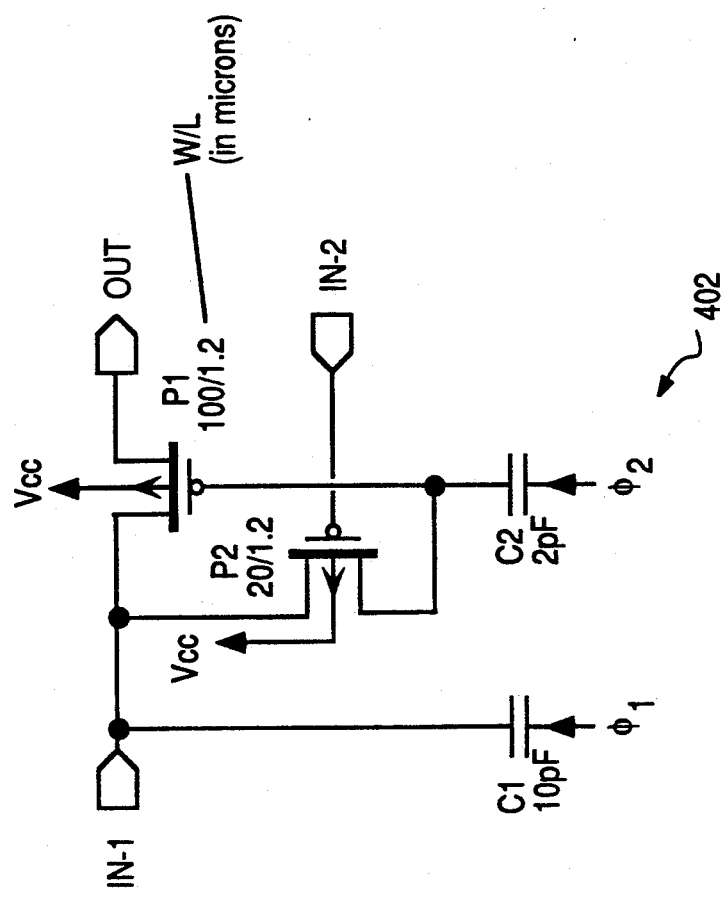
Figure 4C:
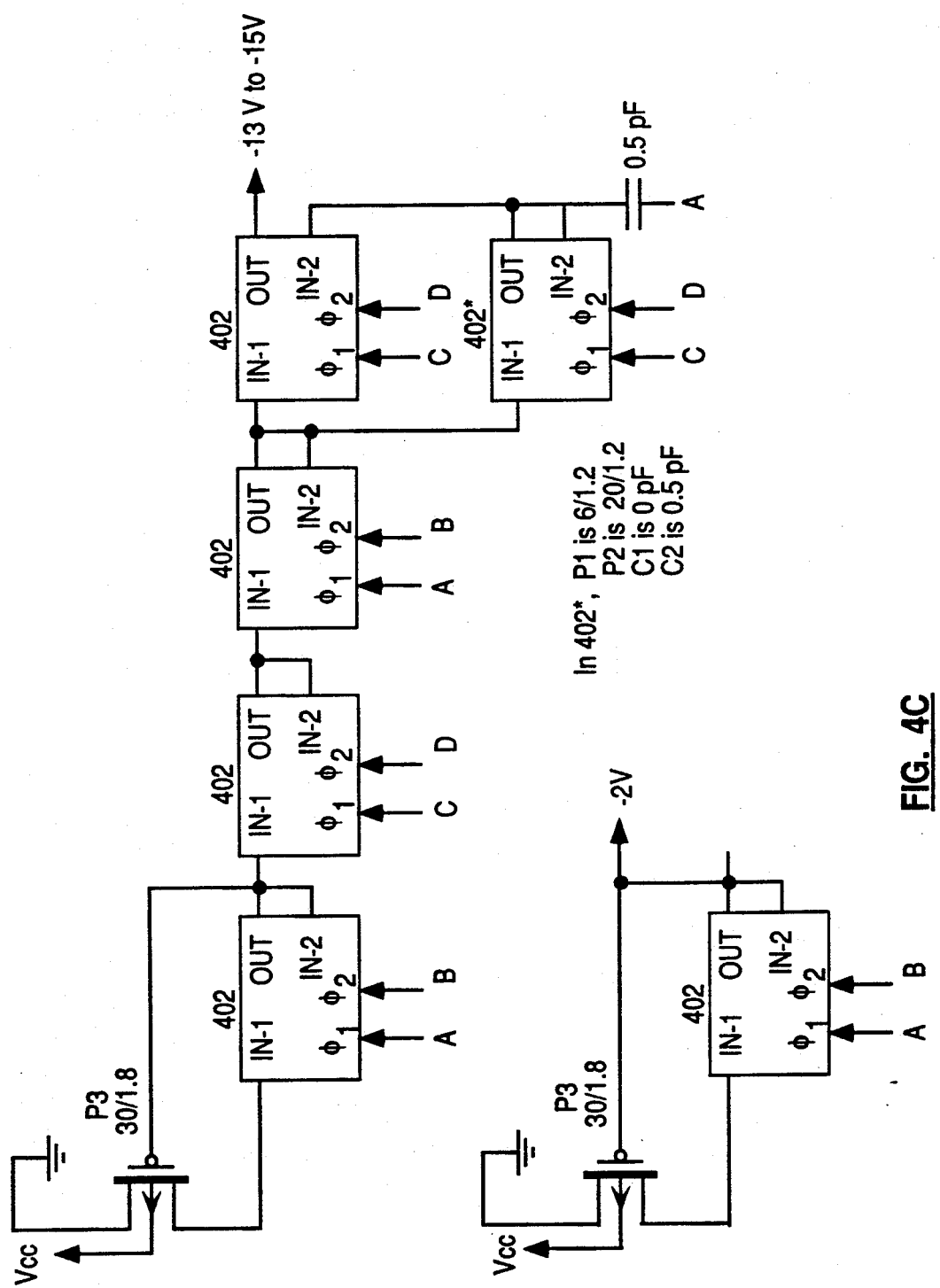
Figure 4D:
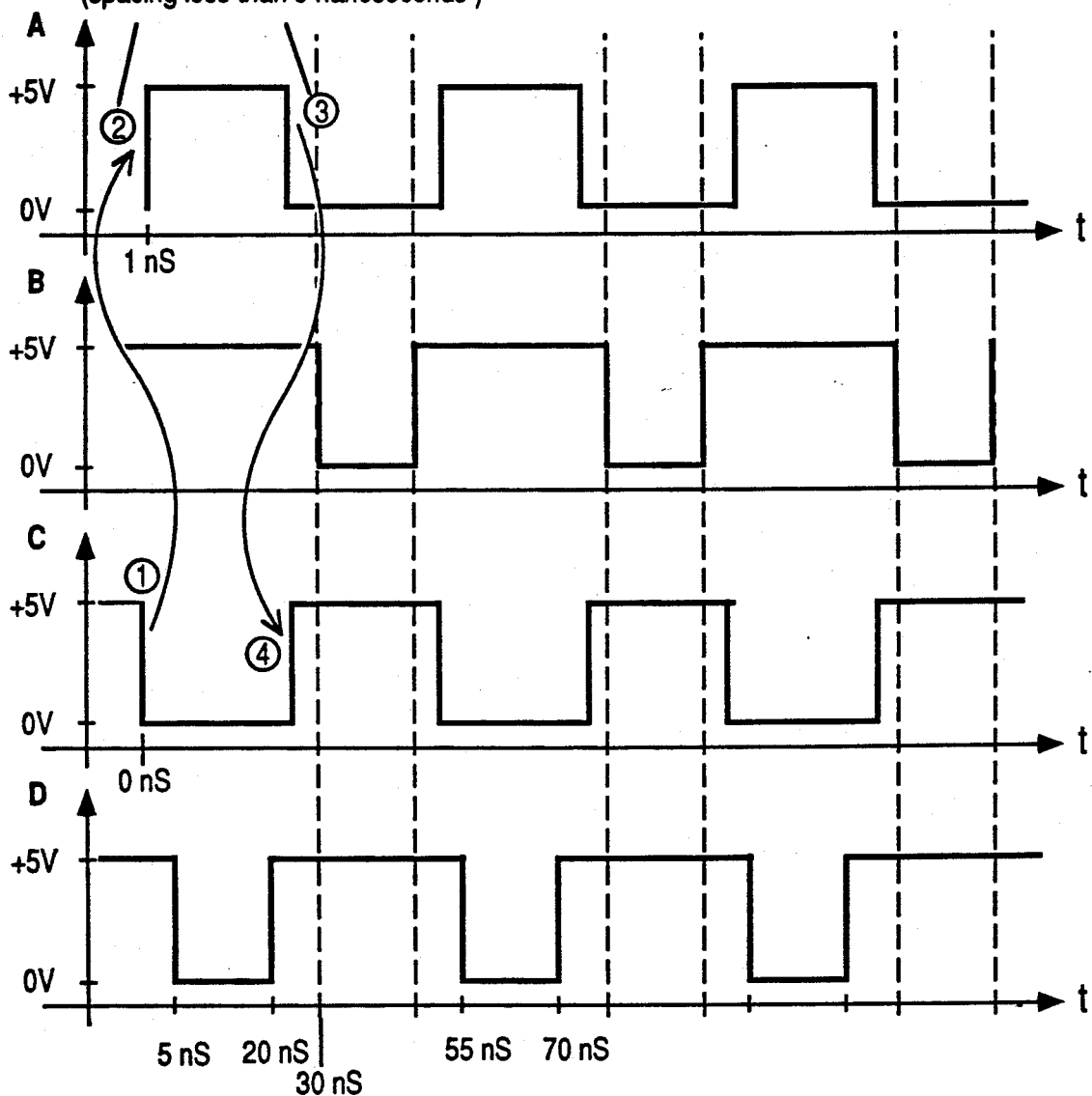
FIG. 4D is a timing diagram showing the phases of signals applied to the negative charge pump circuits of FIG. 4C and the positive charge pump circuits of FIGS. 5B and 5C.

FIGS. 4A–4C are schematic diagrams of charge pump circuits for generating the levels −13 V to −15 V and −2 V in accordance with the invention. FIG. 4D is a timing diagram showing the phases A, B, C, D to be applied to the negative charge pumps of FIGS. 4C and 5. All transistors shown in FIGS. 4A and 4C are P-channel MOSFET's. The capacitors, whose capacitance values are shown in terms of picofarads, are formed as MOS structures having an oxide-nitride-oxide (ONO) dielectric. Conventional oxide dielectrics can, of course, be used also. FIG. 4A is a schematic diagram of a single stage 402 used in forming a negative charge pump. As shown in FIG. 4B, the P- channel transistors of the negative charge pump are defined within a negative voltage tub that is coupled to $V_{CC}$. As shown in FIG. 4C, five stages 402 are used for generating a high level negative voltage of approximately −13 V to −15 V. An additional stage 402 is independently used for generating a low level negative voltage of approximately −2 V.

Figure 5A:
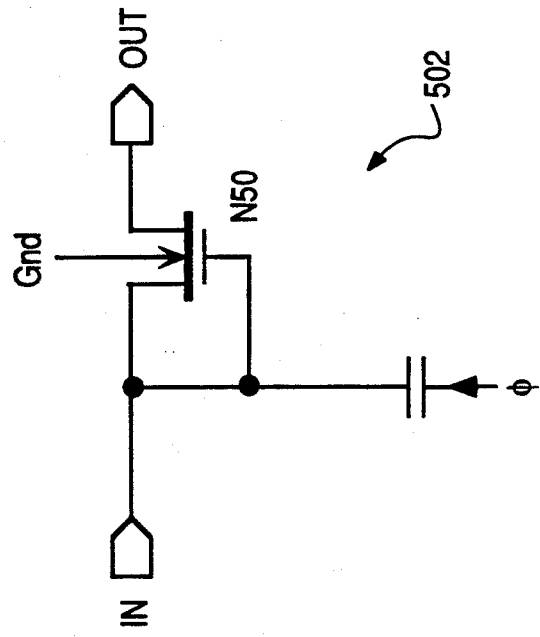
FIGS. 5A–5C are schematics of charge pump circuits for generating +6 V and 12 V.
Figure 5B:
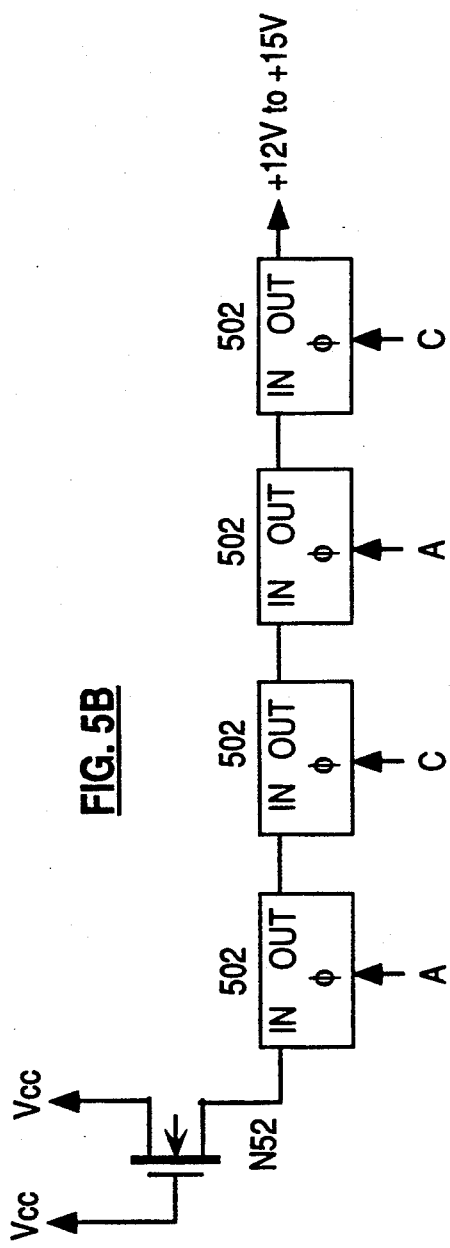
Figure 5C:
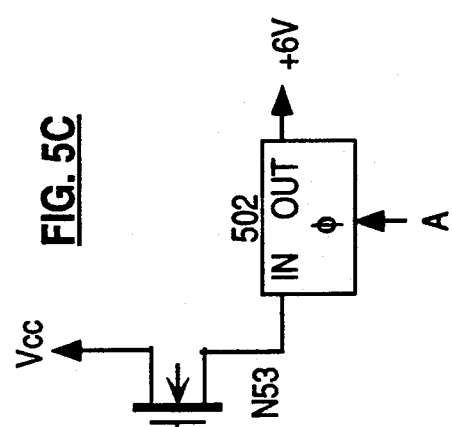

FIGS. 5A through 5C respectively show a single positive voltage charge pump stage 502, a charge pump circuit for generating +12 V and another charge pump circuit for generating +6 V. The same phases A, B, C and D applied to the pump circuits of FIG. 4 are also applied to the pump circuits of FIG. 5, although not all charge pumps need to be activated at the same time. Power is conserved by deactivating those of the charge pump circuits not needed during a specific operation.

Figure 6:
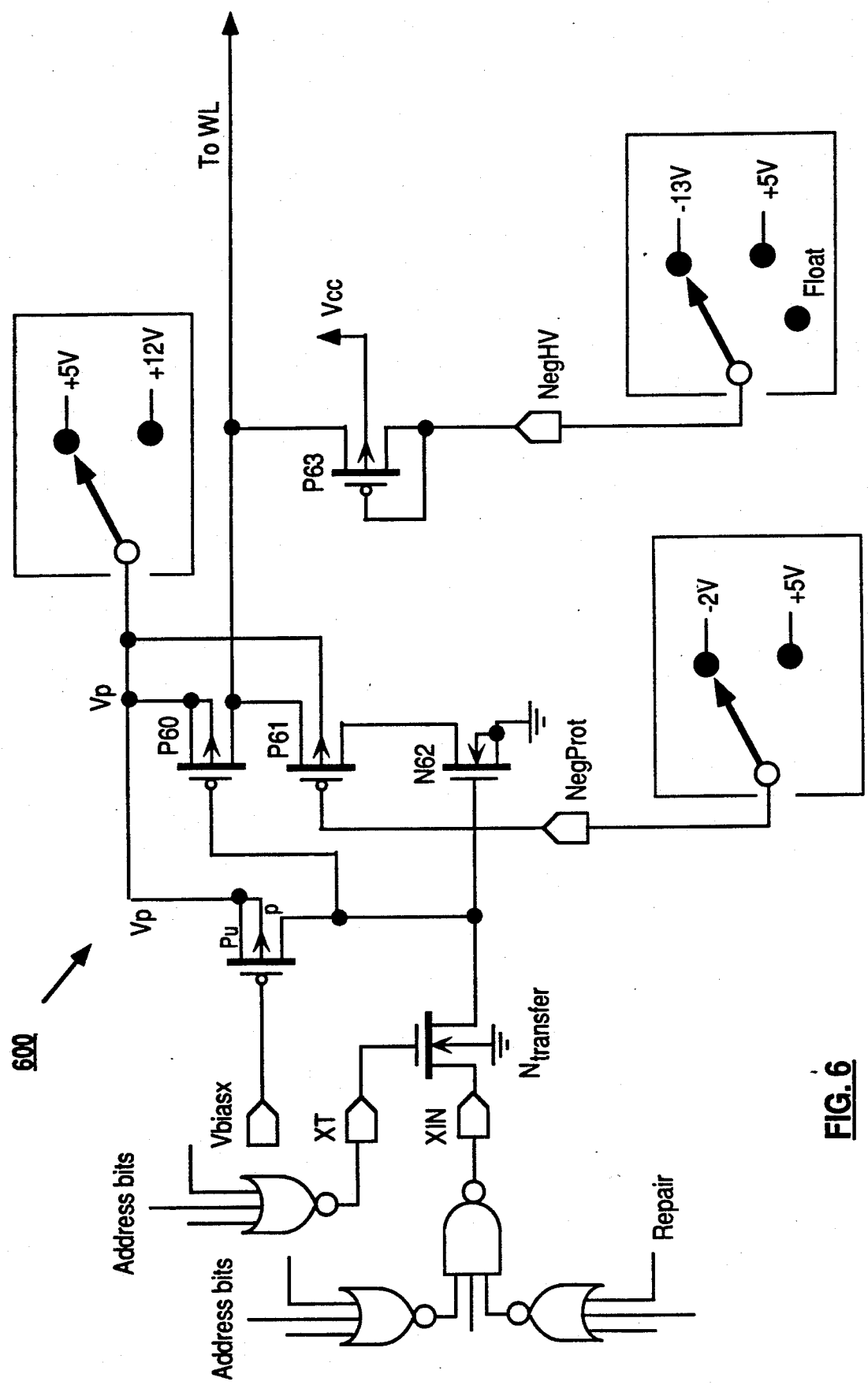
FIG. 6 is a schematic diagram of a gate voltage selecting circuit in accordance with the invention.

FIG. 6 shows a gate voltage selecting circuit 600 in accordance with the invention for selectively applying both positive and negative voltages to the control gates of memory cells 50* such as those shown in FIGS. 2A and 2B. $V_P$ denotes a positive programming voltage, (either +12 V or +5 V) which is applied to the control gates respectively during programming and reading. The below table illustrates the preferred mode for operating the circuit 600 shown in FIG. 6.

TABLE 2

| MODE | VP | Vbiasx | $X_T$ | $X_{in}$ | Negprot | NegHV | $V_{cc}$ | WL |
|---|---|---|---|---|---|---|---|---|
| READ | 5 | 0 | 0/5 | 5/0 | −2 | 5 | 5 | 0/5 |
| PROGRAM | 12 | 5 | 0/5 | 5/0 | −2 | Float | 5 | 0/12 |
| ERASE | 5 | 0 | 0 | — | 5 | −13 | 5 | −12 |
| PROGRAM INHIBIT | 12 | 5 | 0/5 | 5/0 | −2 | Float | 5 | 0 |

In FIG. 6, transistors P60, P61 and N62 function as a logical inverter for inverting the signal passed transistor $N_{transfer}$. When XIN is zero volts and $X_T$ is +5 V, the transistor $N_{transfer}$ pulls low the input to the inverter formed by transistors P60, P61 and N62 thereby applying the voltage $V_p$=+5 V or +12 V to the associated word line (WL). A +5 V potential is applied to the Vbiasx terminal during the program and program inhibit modes. A 0 V potential is applied to the Vbiasx terminal during the read and erase modes. The NegProt P-channel transistor P61 in combination with the series N-channel pull down transistor N62 protects N-channel devices in the row select circuitry from forward bias due to the negative voltages generated by the negative voltage charge pump.

The above described embodiments are merely illustrative of the invention. Various alternate designs will become apparent to those skilled in the art after reading the above disclosure. For example, the invention may be applied to so-called split gate transistors wherein F-N erasure is carried through the drain rather than through the source region. It is to be understood that the scope of the invention is not limited merely to the above described embodiments.

What is claimed is:

1. An array of flash EEPROM memory cells formed on a substrate to define columns and rows, where the substrate includes a common source line extending along at least one of the rows, a plurality of bit lines extending along respective columns, where each memory cell includes an N-type source region coupled to the common source line, a control gate, a floating gate, a channel region and an N-type drain region coupled to a respective one of the bit lines, and where each memory cell is programmable predominantly by transferring hot electrons into its floating gate and is erasable predominantly by tunneling electrons from its floating gate to its source region, the substrate further comprising:

negative voltage supply means for generating and supplying a relatively negative potential to the control gate of each memory cell during flash erasure;

source voltage developing means for developing a relatively low positive voltage on the common source line during flash erasure; and substrate voltage developing means for developing a zero reference voltage in a bulk portion of the substrate during flash erasure.

2. The array of claim 1 wherein the negative potential is in the range $-12$ V to $-17$ V relative to said zero reference voltage.

3. An array according to claim 2 wherein the low positive voltage on the common source line is in the range of $+0.5$ V to $+5.0$ V.

4. The array of claim 1 further comprising a positive voltage supply pin attached to said substrate for supplying a positive read voltage to the drain region of each memory cell during reading, wherein the relatively low positive voltage developed at the source region of each cell during flash erasure is greater than zero but less than or equal to a positive voltage $V_{cc}$ applied to the positive voltage supply pin.

5. An array according to claim 4 wherein said negative voltage supply means includes a charge pump circuit which receives power from said positive voltage supply pin and which generates the negative potential from the received power.

6. The array of claim 5 wherein said negative potential is in the range of $-12$ V to $-17$ V.

7. The array of claim 1 wherein each flash EEPROM memory cell comprises a gate dielectric layer of uniform thickness separating the floating gate from the substrate.

8. An array according to claim 1 wherein the source region of each cell is single-diffused.

9. An array according to claim 1 wherein the drain region of each cell is single-diffused.

10. An array according to claim 9 wherein the source region of each cell is single-diffused.

11. An array according to claim 1 wherein the floating gate of each cell is sandwiched between the control gate and the channel region of the cell.

12. An array according to claim 1 wherein the common source line is diffused into the substrate.

13. An array according to claim 1 wherein the common source line extends along at least two of said rows.

14. An array according to claim 1 wherein the floating gate of each cell is separated from the channel region by a distance of no more than approximately 100 Å.

15. An array according to claim 1 which includes at least one million of said cells.

16. An array according to claim 1 wherein the difference between said low positive voltage on the common source line and said negative potential of each control gate is sufficiently large to induce electron tunneling from the floating gates of said cells to their source regions during flash erasure.

17. An array according to claim 1 wherein the low positive voltage on the common source line is in the range of $+0.5$ V to $+5.0$ V.

18. An array according to claim 1 wherein said low positive voltage is in the range of $+2.0$ V to $+5.0$ V.

19. An array according to claim 1 wherein said low positive voltage is sufficiently low such that an avalanche breakdown effect does not contribute substantially to the magnitude of current flowing from the source region of each cell to a bulk portion of the substrate during flash erasure.

20. An array according to claim 19 wherein the source region of each cell is single-diffused.

21. A method for reprogramming memory cells within a flash EEPROM array using Fowler-Nordheim tunneling for erasure of preprogrammed cells and hot electron injection for the reprogramming of the cells, the array being defined on a semiconductor substrate, each cell including an N-type source region, a P-type channel, an N-type drain region, a floating gate positioned over the channel and a control gate positioned over the floating gate, the method comprising the erasure steps of:

applying a reference voltage of zero volts to the substrate of the array;

applying a positive voltage in the range of approximately zero volts to 5 volts to the source regions of preselected memory cells in the array; and applying a negative voltage in the range of approximately $-12$ volts to $-17$ volts to the control gates of the preselected memory cells in the array thereby to induce Fowler-Nordheim tunneling of electrons from the floating gates of the preselected memory cells to their source regions; and the method further comprising the post-erasure steps of:

applying a positive voltage to the drain regions of cells that are to be programmed; and applying a positive voltage to the control gates of cells that are to be programmed.

22. A method for bypassing erasure of redundant cells on an integrated memory circuit having a predefined addressable memory space and comprising plural rows of flash-erasable electrically-programmable memory cells, each of the cells having an N-type source region, a P-type channel region, an N-type drain region, a floating gate and a control gate the method comprising:

providing more rows of memory cells on the integrated circuit than necessary for filling the predefined memory space of the integrated memory circuit;

designating one or more of the rows as rows to be bypassed during normal addressing operations;

applying a negative erase voltage to the control gates of memory cells in rows which are not to be bypassed; and providing a non-negative voltage to the control gate of memory cells in rows which are to be bypassed to thereby disable erasure of those memory cells.

23. The method of claim 22 wherein the negative erase voltage is in the range $-12$ V to $-17$ V.

24. The method of claim 23 wherein said non-negative voltage is zero volts.

25. A method for flash erasing the memory cells of a flash EEPROM array formed on an integrated circuit having only a $V_{cc}$ pin and a ground pin for supplying power from an external source into the integrated circuit, the integrated circuit including rows of memory cells and a common source line extending along the rows, each cell including a source region coupled to the common source line and a control gate, the method comprising the steps of:

generating a source voltage of a same polarity as that of an external voltage present on the $V_{cc}$ pin;

applying the source voltage to source regions of the memory cells during flash erasure;

generating a gate voltage within the integrated circuit of a polarity opposite to the source voltage; and applying the opposite polarity gate voltage to the control gates of the memory cells during flash erasure.

26. The method of claim 25 wherein each cell is erasable by Fowler-Nordheim tunneling and programmable by hot electron injection.

27. The method of claim 25 wherein the source region of each cell includes an N-type semiconductor, the source voltage is in the range of $+0.5$ V to $+5.0$ V and the gate voltage is in the range $-17$ V to $-12$ V.

28. The method of claim 25 wherein erasure of one or more rows in said array is inhibited by applying an erase-inhibiting voltage of a polarity the same as that of said source voltage to the control gates of memory cells which are not to be erased during said flash erasure operation.

29. An integrated memory circuit having a program mode, a flash-erase mode and a read mode, the circuit comprising:

a substrate;

a matrix of electrically programmable and electrically erasable memory cells defined on the substrate, the cells being organized in rows and columns, each memory cell including a source region, a drain region a channel region interposed between the source and drain regions, a floating gate insulatively disposed over the channel region and a control gate insulatively disposed over the floating gate;

a common source line connected to the source regions of memory cells in at least one row of said matrix;

a plurality of word lines each extending along a corresponding row of said matrix and each connected to the control gates of memory cells in its corresponding row;

a plurality of bit lines each extending along a corresponding column of said matrix and each connected to the drain regions of memory cells in its corresponding column;

source line switching means, connected to the common source line, for switchingly connecting the common source line to an erase-mode source voltage during the flash-erase mode, to a program-mode source voltage during the program mode, and to a read-mode source voltage during the read mode;

a plurality of word line switching means each connected to a respective one of said word lines for switchingly connecting the respective word line to either an erase-enable (E) gate voltage or an erase-inhibit (EI) gate voltage during the flash-erase mode, to either a program-enable (P) gate voltage or a program-inhibit (PI) gate voltage during the program mode and to either a read-enable (R) gate voltage or a read-inhibit (RI) gate voltage during the read mode; and a plurality of bit line switching means each connected to a respective one of said bit lines for switchingly connecting the respective bit line to an erase-enable (E) drain impedance during the flash-erase mode, to either a program-enable (P) drain voltage or a program-inhibit (PI) drain voltage during the program mode and to either a read-enable (R) drain voltage or a read-inhibit (RI) drain voltage during the read mode;

wherein said erase-enable gate voltage is nonzero and of opposite polarity to said erase-mode source voltage, the difference between the erase-enable gate voltage and the erase-mode source voltage being sufficient to substantially remove charge from the floating gates of memory cells whose control gates are at the erase-enable gate voltage; and wherein the difference between the erase-inhibit gate voltage and the erase-mode source voltage is insufficient to substantially remove charge from the memory cells whose control gates are at the erase-inhibit gate voltage during the flash-erase mode.

30. An integrated memory circuit according to claim 29 wherein:

each word line switching means includes row repair means for disconnecting its respective word line from the erase-enable gate voltage during the flash-erase mode and from the read-enable gate voltage during the read mode.

31. An integrated memory circuit according to claim 30 wherein:

each bit line switching means includes column repair means for disconnecting its respective bit line from the read-enable drain voltage during the read mode.

32. An integrated memory circuit according to claim 30 wherein the two repair means includes means for connecting the respective word line of its word line switching means to the erase-inhibit gate voltage during the flash-erase mode.

33. An integrated memory circuit according to claim 29 wherein the common source line connects to the source regions of all memory cells in said matrix.

34. An array of flash-erasable electrically-programmable memory cells, the array comprising:

a substrate;

a common source line defined in the substrate;

a wordline running parallel to the source line;

a row of erasably programmable transistors each having a source region connected to the common source line, a control gate connected to the wordline, a floating gate for storing charge carriers, a thin dielectric separating the floating gate from the source region such that charge carriers may tunnel from the floating gate to the source region, a channel region and a drain region;

a plurality of bit lines running orthogonally to the wordline, each bit line being connected to the drain region of a corresponding one of said transistors;

first voltage supply means defined on the substrate to charge said common source line to a first voltage level for inducing stored charge carriers to tunnel from the floating gates of said transistors to their respective source regions; and second voltage supply means defined on the substrate to charge the wordline to a second voltage level for further inducing stored charge carriers to tunnel from the floating gates of said transistors to their respective source regions.

35. The array of claim 34 wherein the source region of each transistor is single diffused.

36. The array of claim 35 wherein each source region is composed of arsenic.

37. The array of claim 34 wherein the drain region of each transistor is single diffused.

38. The array of claim 34 wherein the floating gate of each transistor is sandwiched between the control gate and the channel region of the transistor.

39. The array of claim 34 wherein the thin dielectric covers the channel region and is of uniform thickness over the channel region.

40. The array of claim 39 wherein each floating gate and corresponding source region have adjacent edge portions and wherein charge carriers tunnel through a source overlap region located in the vicinity of the adjacent edge portions.

41. The array of claim 34 wherein said substrate is housed in a package having a $V_{cc}$ pin and said first and second voltage supply means receive power from the $V_{cc}$ pin.

42. A method for inhibiting erasure in one or more preselected rows of a flash-EEPROM array during flash erasure where each row of the array has a plurality of memory cells and where each cell has a control gate coupled to a word line extending along the cell's row and a source region coupled to a common source line, the method comprising the steps of:
applying a first erase-enabling voltage to the common source line;
applying a second erase-enabling voltage to the word lines of rows whose cells are to be flash erased, the difference between said first and second erase-enabling voltages being sufficient to enable erasure of the to-be-erased cells; and
developing an erase-inhibiting voltage on the word lines of rows whose cells are not to be erased, the difference between said first erase-enabling voltage and said erase-inhibiting voltage being insufficient to enable erasure of the not-to-be erased cells.

43. The method of claim 42 wherein each cell is an N-channel field-effect transistor and said first erase-enabling voltage is in the range +0.5 V to +5.0 V relative to a bulk portion of said array.

44. The method of claim 43 wherein said erase-inhibiting voltage is non-negative relative to the bulk portion of the array.

45. A method for flash erasing an array of EEPROM memory cells provided on an integrated circuit substrate where each memory cell includes a stacked-gate transistor having a channel region, a floating gate uniformly spaced above the channel region by a tunneling dielectric, a control gate insulatively disposed above the floating gate, a source region at one side of the channel region and a drain region at an opposed second side of the channel region and where the integrated circuit substrate receives power through a ground terminal and a Vcc terminal provided for connecting the substrate to an external power supply, the method comprising the steps of:
applying simultaneously to the source regions of a plurality of said memory cells, a source voltage of a magnitude sufficiently low to suppress avalanche-dominated conduction of current between the source regions of said cells and the substrate;
applying simultaneously to the control gates of said plurality of memory cells, an erase-enabling gate voltage of sufficient magnitude such that the combination of said source voltage and said erase-enabling gate voltage is sufficient to induce tunneling of a substantial number of charge carries between the floating gates and source regions of said plural memory cells to thereby erase charge from said floating gates; and
supplying current through said Vcc terminal for developing both the source voltage and the erase-enabling voltage.

46. The method of claim 45 further including the steps of:
providing a first charge pump circuit on said substrate for developing said erase-enabling gate voltage, the first charge pump receiving power from Vcc terminal; and
providing a second charge pump circuit on said substrate for developing a program-enabling drain voltage to be applied to the drain regions of said memory cells during programming, the second charge pump receiving power from said Vcc terminal.

47. A method for minimizing hot hole trapping in a flash-erasable EPROM array where the array comprises a plurality of stacked-gate transistors defined on a semiconductor substrate, each transistor having a channel region, a floating gate insulatively spaced apart from the channel region by a tunneling dielectric of uniform thickness, a control gate insulatively disposed above the floating gate, a source region at one side of the channel region and a drain region at an opposed second side of the channel region,
the method comprising the steps of, during flash-erasure of the array;
applying simultaneously to the source regions of a plurality of said transistors, a source voltage of a magnitude sufficiently low to suppress avalanche-dominated conduction of current between the source regions of said cells and the substrate to thereby suppress the generation of hot holes which may become trapped in said tunneling dielectric;
applying simultaneously to the control gates of said plurality of transistors, an erase-enabling gate voltage of sufficient magnitude such that the combination of said source voltage and said erase-enabling gate voltage is sufficient to induce tunneling of a substantial number of charge carries between the floating gates and source regions of said plural memory cells to thereby erase charge from said floating gates; and
supplying current from a single power supply for developing both the source voltage and the erase-enabling gate voltage.

48. The method of claim 47 further including the steps of:
providing a first charge pump circuit on said substrate for developing said erase-enabling gate voltage, the first charge pump receiving power from said single power supply; and
providing a second charge pump circuit on said substrate for developing a program-enabling drain voltage to be applied to the drain regions of said transistors during programming, the second charge pump receiving power from said single power supply.

49. A method for minimizing power consumption in a flash-erasable EPROM array where the array comprises a plurality of stacked-gate transistors defined on a semiconductor substrate, each transistor having a channel region, a floating gate insulatively spaced apart from the channel region by a tunneling dielectric of uniform thickness, a control gate insulatively disposed above the floating gate, a source region at one side of the channel region and a drain region at an opposed second side of the channel region, the method comprising the steps of, during flash-erasure of the array:

applying simultaneously to the source regions of a plurality of said transistors, a source voltage of a magnitude sufficiently low to suppress avalanche-dominated conduction of current between the source regions of said cells and the substrate to thereby suppress the generation of hot holes;

applying simultaneously to the control gates of said plurality of transistors, an erase-enabling gate voltage of sufficient magnitude such that the combination of said source voltage and said erase-enabling gate voltage is sufficient to induce tunneling of a substantial number of charge carries between the floating gates and source regions of said plural memory cells to thereby erase charge from said floating gates; and supplying current from a single power supply for developing both the source voltage and the erase-enabling gate voltage.

50. A method for measuring the relation between source current ($I_s$), source voltage ($V_s$) and control gate voltage during tunneling of charge carriers from a normally-floating charge-storing gate of a memory cell to a source region of the cell, the method comprising:

attaching a current injecting line to the normally-floating gate;

coupling a first variable voltage source to the current injecting line to produce a variable float voltage ($V_F$) thereat;

coupling a second variable voltage source to the source region of the cell to produce a variable source voltage ($V_S$) thereat;

varying the source voltage ($V_S$) over a predetermined range; and measuring the amount of current ($I_S$) consumed by the source region.

51. The method of claim 50 further comprising:

computing a control gate voltage necessary for inducing the float voltage ($V_F$) on the normally-floating gate when that gate is normally floating.

* * * * *

UNITED STATES PATENT AND TRADEMARK OFFICE
CERTIFICATE OF CORRECTION

PATENT NO.   :  5,077,691
DATED        :  December 31, 1991
INVENTOR(S)  :  Sameer S. Haddad et al.

It is certified that error appears in the above-identified patent and that said Letters Patent is hereby corrected as shown below:

Col. 1, line 12, delete "EEPPROM's" and insert --EEPROM's--.

Col. 2, line 22, delete "12V" and insert --+12V--.

Col. 5, line 31, delete "12V" and insert --+12V--.

Col. 9, line 21, delete "pass" and insert --passing--.

Signed and Sealed this

Seventh Day of December, 1993

Attest:

BRUCE LEHMAN

*Attesting Officer*     Commissioner of Patents and Trademarks